United States Patent
Kobayashi et al.

(10) Patent No.: US 10,389,328 B2
(45) Date of Patent: Aug. 20, 2019

(54) DIFFERENTIAL MODE FILTER

(71) Applicant: TDK Corporation, Tokyo (JP)

(72) Inventors: Tsutomu Kobayashi, Tokyo (JP); Toshio Tomonari, Tokyo (JP); Emi Ito, Tokyo (JP); Yuma Komaya, Tokyo (JP)

(73) Assignee: TDK CORPORATION, Tokyo (JP)

( * ) Notice: Subject to any disclaimer, the term of this patent is extended or adjusted under 35 U.S.C. 154(b) by 52 days.

(21) Appl. No.: 15/723,392

(22) Filed: Oct. 3, 2017

(65) Prior Publication Data

US 2018/0097497 A1  Apr. 5, 2018

(51) Int. Cl.
H03H 7/09 (2006.01)
H03H 7/42 (2006.01)
H01F 19/00 (2006.01)
H03H 1/00 (2006.01)

(52) U.S. Cl.
CPC ............. H03H 7/09 (2013.01); H01F 19/00 (2013.01); H03H 1/0007 (2013.01); H03H 7/425 (2013.01); H03H 7/427 (2013.01); H03H 2001/0035 (2013.01)

(58) Field of Classification Search
CPC .... H03H 1/0007; H03H 7/427; H03H 7/0115; H03H 7/09; H03H 7/425

USPC .................................................. 333/181, 185
See application file for complete search history.

(56) References Cited

FOREIGN PATENT DOCUMENTS

| JP | 2007-036158 A | 2/2007 |
| JP | 2010-165953 A | 7/2010 |

OTHER PUBLICATIONS

English translation of JP2010165953 (Year: 2010).*

* cited by examiner

*Primary Examiner* — Rakesh B Patel
(74) *Attorney, Agent, or Firm* — Young Law Firm, P.C.

(57) ABSTRACT

Disclosed herein is a differential mode filter that includes first and second terminal electrodes provided on a first flange part of a core, and first and second wires wound around a winding core part of the core in an opposite direction to each other and connected respectively to the first and second terminal electrodes. The first and second wires cross each other on the winding core part to form a plurality of crossing portions that include first, second, and third crossing portions that are first, second, and third occurrences counting from the one end of the first and second wires, respectively. A first crossing angle between the first and second wires at the first crossing portion is larger than at least one of second and third crossing angles between the first and second wires at the second and third portions, respectively.

20 Claims, 15 Drawing Sheets

DIFFERENTIAL MODE FILTER

BACKGROUND OF THE INVENTION

Field of the Invention

The present invention relates to a differential mode filter and, more particularly to a differential mode filter excellent in high-frequency characteristics.

Description of Related Art

A differential mode filter is used as a device passing a common mode component on a differential signal line therethrough while blocking a differential mode component (see Japanese Patent Application Laid-open Nos. 2007-036158 and 2010-165953).

As described in Japanese Patent Application Laid-open Nos. 2007-036158 and 2010-165953, in the differential mode filter, a pair of wires are wound in opposite directions, so that they cross each other a plurality of times on a winding core. This is a structural feature of the differential mode filter.

In the differential mode filters described in Japanese Patent Application Laid-open Nos. 2007-036158 and 2010-165953, the crossing angle between a pair of wires is kept constant (see FIG. 5 of Japanese Patent Application Laid-open No. 2007-036158 and FIG. 2 of Japanese Patent Application Laid-open No. 2010-165953). However, when the crossing angle between the wires is made constant, high-frequency characteristics may be degraded by a capacitance component between the wires and terminal electrodes.

SUMMARY

It is therefore an object of the present invention to improve high-frequency characteristics of a differential mode filter.

A differential mode filter according to an aspect of the present invention includes a core having a winding core part extending in an axial direction and a first flange part provided at one end of the winding core part in the axial direction, first and second terminal electrodes provided on the first flange part, a first wire wound around the winding core part in a first winding direction and having one end connected to the first terminal electrode, and a second wire wound around the winding core part in a second winding direction opposite to the first winding direction and having one end connected to the second terminal electrode. The first and second wires cross each other on the winding core part to form a plurality of crossing portions that include first, second, and third crossing portions that are first, second, and third occurrences counting from the one end of the first and second wires, respectively. A first crossing angle between the first and second wires at the first crossing portion is larger than at least one of second and third crossing angles between the first and second wires at the second and third portions, respectively.

According to the present invention, the crossing angle at the first crossing portion is large, so that the capacitance component generated between the wires and the terminal electrodes is reduced as compared to that when the crossing angle between the wires is kept constant. As a result, excellent high-frequency characteristics can be obtained.

In the present invention, the first crossing angle is preferably larger than both the second and third crossing angles. With this configuration, it is possible to reduce the capacitance component generated between the wires and the terminal electrodes while suppressing an increase in the core size.

In the present invention, it is preferable that the winding core part has a first winding surface, that the first flange part has a first surface facing a same direction as the first winding surface, that the first and second terminal electrodes are formed on at least the first surface of the first flange part, and that the first crossing portion is positioned on the first winding surface. This is because, in such a configuration, a capacitance component is likely to be generated between the wires on the first winding surface and the first and second terminal electrodes.

In this case, the winding core part further may have a second winding surface opposite to the first winding surface, the second crossing portion may be positioned on the second winding surface of the winding core part, the third crossing portion may be positioned on the first winding surface of the winding core part, and the second crossing angle may be different from the third crossing angle. Further, in this case, the first and second wires preferably contact each other in the axial direction on one of the first and second winding surfaces. With this configuration, variations in the winding position of the wires can be suppressed. This in turn can reduce variations in high-frequency characteristics.

In the present invention, it is preferable that the core further has a second flange part provided at other end of the winding core part in the axial direction, that the second flange part is provided with a third terminal electrode connected with other end of the first wire and a fourth terminal electrode connected with other end of the second wire, that the plurality of crossing portions further include fourth, fifth, and sixth crossing portions that are first, second, and third occurrences counting from the other end of the first and second wires, respectively, and that a fourth crossing angle between the first and second wires at the fourth crossing portion is larger than at least one of fifth and sixth crossing angles between the first and second wires at the fifth and sixth portions, respectively. With this configuration, the capacitance component generated between the wires and the terminal electrodes is reduced still further, so that more improved high-frequency characteristics can be obtained.

In this case, it is preferable that the winding core part further has a second winding surface positioned opposite to the first winding surface, that the second flange part has a second surface facing a same direction as the second winding surface, and that the third and fourth terminal electrodes are formed on at least the second surface of the second flange part. This is because, in such a configuration, a capacitance component is likely to be generated between the wires on the second winding surface and the third and fourth terminal electrodes.

In the present invention, the winding core part preferably has a substantially quadrangular shape in cross section perpendicular to the axial direction. With this configuration, the winding core part has corner portions, so that the wire position can be stabilized.

A differential mode filter according to another aspect of the present invention includes: a core having a winding core part extending in an axial direction, a first flange part provided at one end of the winding core part in the axial direction, and a second flange part provided at other end of the winding core part in the axial direction; first and second terminal electrodes provided on the first flange part; third and fourth terminal electrodes provided on the second flange part; a first wire wound around the winding core part in a first winding direction and having one and other ends connected respectively to the first and third terminal electrodes; and a second wire wound around the winding core part in a second winding direction opposite to the first winding direction and having one and other ends connected respectively to the second and fourth terminal electrodes. The first and second wires cross each other on the winding core part to form a plurality of crossing portions that include first, second, and a plurality of third crossing portions, the first crossing portion being a first occurrence counting from the one end of the first and second wires, the second crossing portion being a first occurrence counting from the other end of the first and second wires, the third crossing portions being positioned between the first crossing portion and the second crossing portion. At least one of a first crossing angle between the first and second wires at the first crossing portion and a second crossing angle between the first and second wires at the second crossing portion is larger than an average value of third crossing angles between the first and second wires at the third crossing portions.

According to the present invention, the crossing angles at the crossing portions positioned at both ends are large, so that the capacitance component generated between the wires and the terminal electrodes is reduced as compared to that when the crossing angle between the wires are kept constant. As a result, excellent high-frequency characteristics can be obtained.

In the present invention, both the first and second crossing angles are preferably larger than the average value of the third crossing angles. With this configuration, the capacitance component generated between the wires and the terminal electrodes is reduced further, so that more improved high-frequency characteristics can be obtained.

In the present invention, the at least one of the first and second crossing angles is preferably larger than any one of the third crossing angles. With this configuration, it is possible to reduce the capacitance component generated between the wires and the terminal electrodes while suppressing an increase in the core size.

As described above, according to the present invention, there can be provided a differential mode filter having enhanced high-frequency characteristics.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

<First Embodiment>

Figure 1:
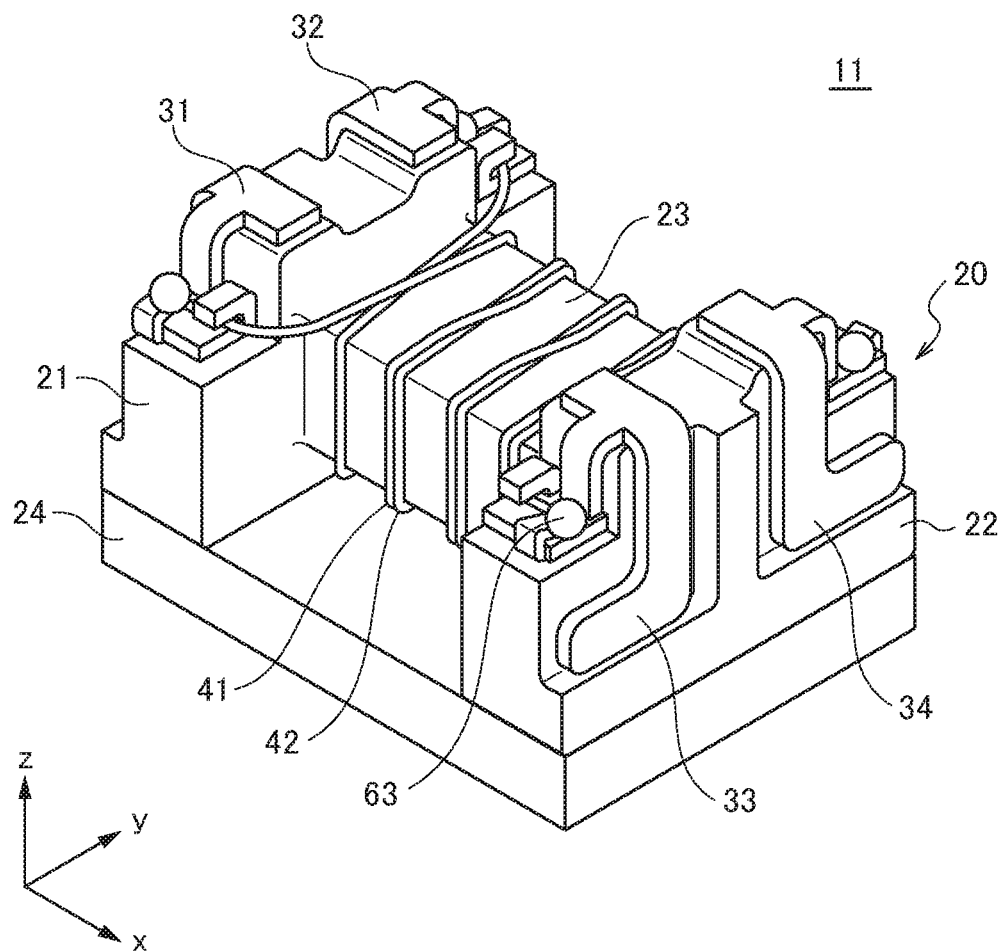
FIG. 1 is a schematic perspective view illustrating an outer appearance of a differential mode filter according to a first embodiment of the present invention.

FIG. 1 is a schematic perspective view illustrating the outer appearance of the differential mode filter 11 according to the first embodiment of the present invention.

Figure 2:
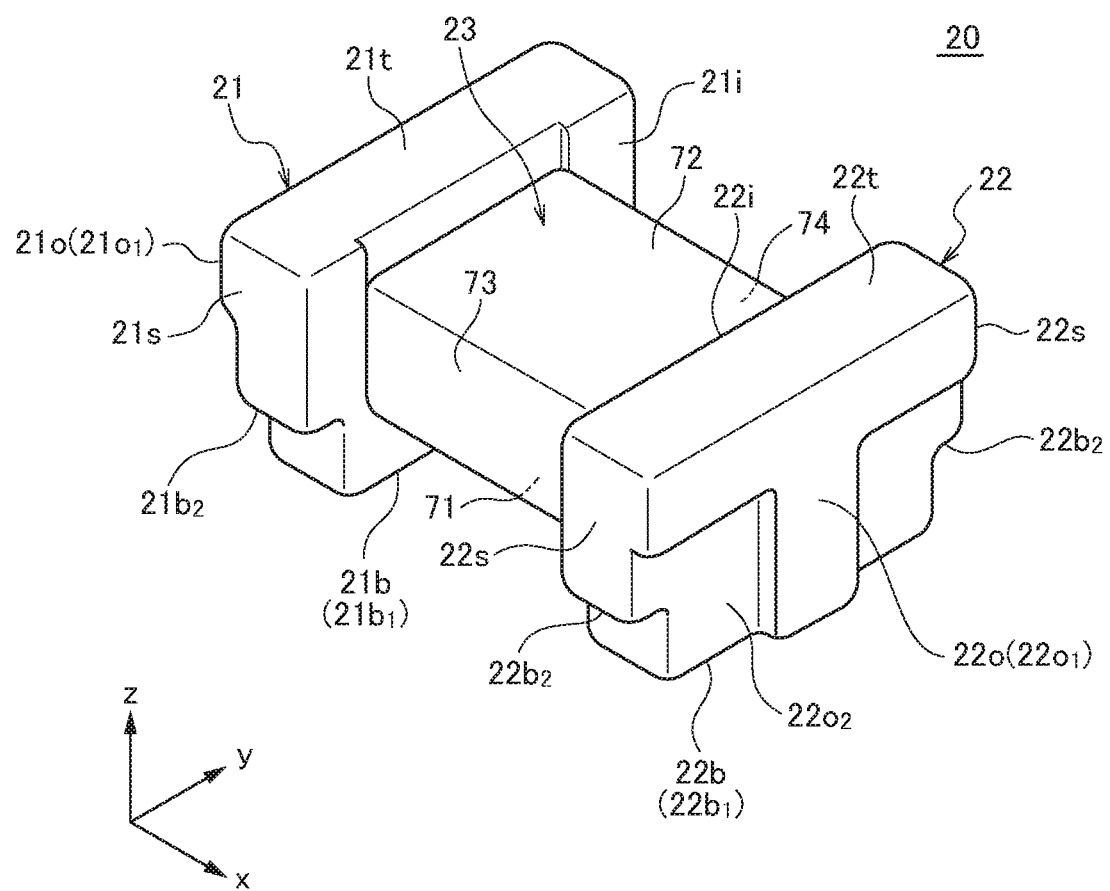
FIG. 2 is a schematic perspective view illustrating a core shown in FIG. 1.
Figure 3:
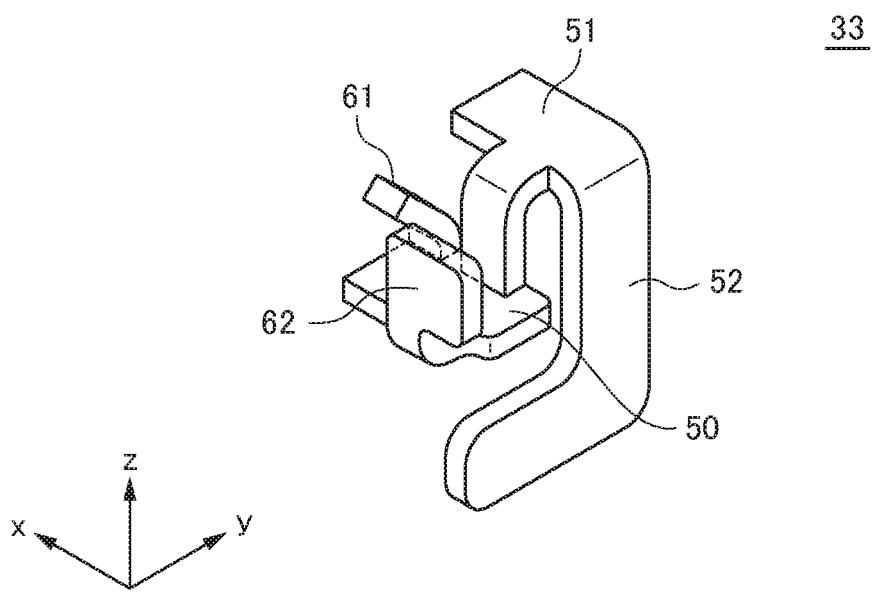
FIG. 3 is a schematic perspective view illustrating a terminal electrode shown in FIG. 1.

As illustrated in FIG. 1, the differential mode filter 11 according to the present embodiment includes a drum core 20, a plate core 24, first to fourth terminal electrodes 31 to 34, and first and second wires 41 and 42 wound in opposite directions to each other. The structure of the core 20 is illustrated in FIG. 2, and the structure of the third terminal electrode 33 is illustrated in FIG. 3. The cores 20 and 24 are each formed of a magnetic material having a comparatively high permeability, such as an Ni—Zn based ferrite. The first to fourth terminal electrodes 31 to 34 are each a metal fitting formed of a good conductor material such as copper.

The core 20 has a first flange part 21, a second flange part 22, and a winding core part 23 disposed between the first and second flange parts 21 and 22. The winding core part 23 has its axis direction in the x-direction. The first and second flange parts 21 and 22 are disposed at both ends of the winding core part 23 in the axial direction and integrally formed with the winding core part 23. The first flange part 21 has an inner side surface 21i connected to the winding core part 23, an outer side surface 21o positioned on the side opposite the inner side surface 21i, a top surface 21t to which the plate core 24 is bonded, a bottom surface 21b positioned on the side opposite the top surface 21t, and side surfaces 21s positioned on sides opposite each other. The inner side surface 21i and outer side surface 21o each constitute the yz plane, the top surface 21t and bottom surface 21b each constitute the xy plane, and the side surfaces 21s each constitute the xz plane. Similarly, the second flange part 22 has an inner side surface 22i and an outer side surface 22o each constituting the yz plane, a top surface 22t and a bottom surface 22b each constitute the xy plane, and two side surfaces 22s each constitute the xz plane.

As illustrated in FIG. 2, the bottom surfaces 21b, 22b and outer side surfaces 21o, 22o each have a step. Specifically, the bottom surface $21b$ has an upper stage surface $21b_1$ and a lower stage surface $21b_2$, the bottom surface $22b$ has an upper stage surface $22b_1$ and a lower stage surface $22b_2$, the outer side surface $21o$ has an upper stage surface $21o_1$ and a lower stage surface $21o_2$, and the outer side surface $22o$ has an upper stage surface $22o_1$ and a lower stage surface $22o_2$. The first and second terminal electrodes 31 and 32 are disposed so as to cover the upper stage surface $21b_1$, lower stage surface $21b_2$ and lower stage surface $21o_2$ of the first flange part 21. The third and fourth terminal electrodes 33 and 34 are disposed so as to cover the upper stage surface $22b_1$, lower stage surface $22b_2$, and lower stage surface $22o2$ of the second flange part 22. Fixing of the first to fourth terminal electrodes 31 to 34 is made by using an adhesive or the like.

As illustrated in FIG. 3, the third terminal electrode 33 has a wire connection part 50, a first connection part 51, and a second connection part 52. The wire connection part 50 is a part that covers the lower stage surface $22b2$ of the bottom surface $22b$ and is connected with one end of the first wire 41. As illustrated in FIG. 3 which illustrates a state before wire connection, the wire connection part 50 has a fixing piece 61 for holding one end of the first wire 41 and a welding piece 62 for welding the one end of the first wire 41 thereto. Specifically, the wire connection is made as follows. That is, in a state where the fixing piece 61 is folded to hold the one end of the first wire 41, the welding piece 62 is folded to hold the one end of the first wire 41 between the wire connection part 50 and the welding piece 62, and then laser beam is irradiated to melt the welding piece 62, to thereby weld the one end of the first wire 41 to the wire connection part 50. After the welding, a weld ball 63 illustrated in FIG. 1 is formed, whereby the one end of the first wire 41 and the wire connection part 50 are firmly fixed.

The first connection part 51 is a part that covers the upper stage surface $22b_1$ of the bottom surface $22b$ and faces a land pattern on a printed circuit board at mounting. The second connection part 52 is a part that covers the lower stage surface $22o_2$ of the outer side surface $22o$ and is a part at which a solder fillet is formed at mounting. In the present embodiment, the second connection part 52 has a shape folded in an L-shape, whereby the mounting strength is enhanced.

Other terminal electrodes 31, 32, and 34 have the same structure. The one and the other ends of the first wire 41 are connected to the first and third terminal electrodes 31 and 33, respectively, and one and the other ends of the second wire 42 are connected to the second and fourth terminal electrodes 32 and 34, respectively. As a result, there is formed a differential mode filter circuit in which, for example, a pair of the first and second terminal electrodes 31 and 32 serve as an input side and a pair of the third and fourth terminal electrodes 33 and 34 serve as an output side. However, the differential mode filter 11 according to the present embodiment has no directivity, so that it is possible to use the pair of third and fourth terminal electrodes 33 and 34 as the input side and the pair of the first and second terminal electrodes 31 and 32 as the output side. Further, the terminal electrodes 31 to 34 each have the structure illustrated in FIG. 3, so that firm connection to the corresponding wires 41 and 42 can be made. In addition, the weld ball 63 is formed in the lower stage surfaces $21b_2$ and $22b_2$ of the bottom surfaces $21b$ and $22b$, so that it is possible to prevent unstable mounting which may be caused due to interference between the weld ball 63 and the printed board.

Figure 4:
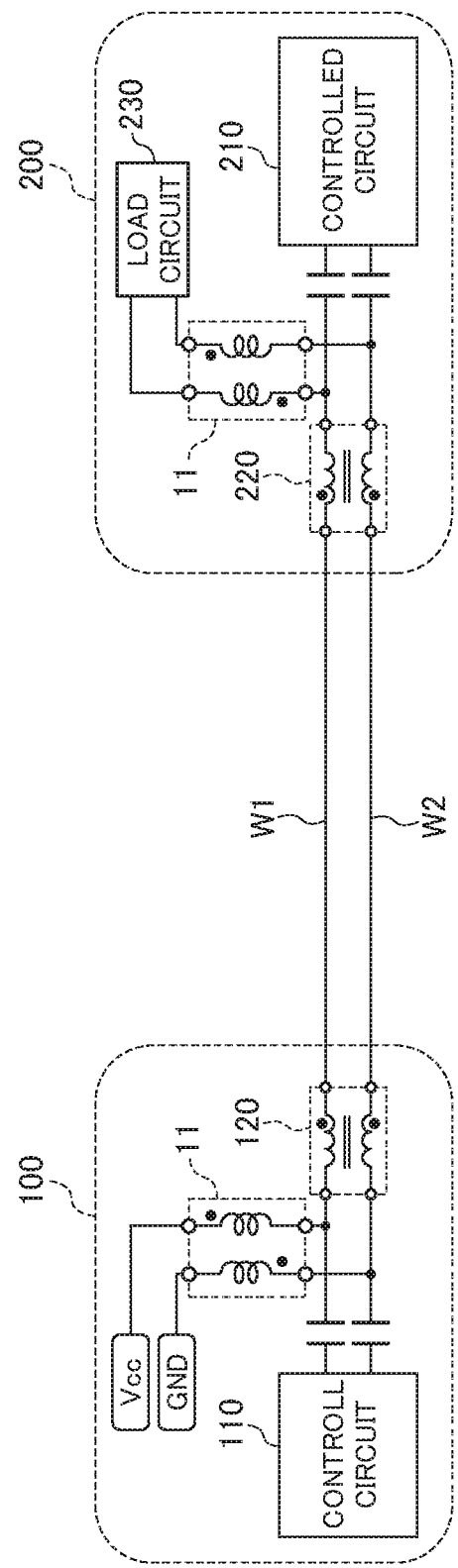
FIG. 4 is a circuit diagram for explaining an example of use of the differential mode filter shown in FIG. 1.

FIG. 4 is a circuit diagram for explaining an example of use of the differential mode filter 11 according to the present embodiment.

In the example of FIG. 4, a control device 100 and a controlled device 200 are connected to each other through a pair of differential signal lines W1 and W2. The control device 100 includes a control circuit 110 that outputs a differential signal to the differential signal lines W1 and W2 and a common mode filter 120 that removes common mode noise superimposed on the differential signal lines W1 and W2. The controlled device 200 includes a controlled circuit 210 that receives the differential signal transmitted through the differential signal lines W1 and W2 and a common mode filter 220 that removes common mode noise superimposed on the differential signal lines W1 and W2. With this configuration, the differential signal can be supplied from the control circuit 110 to controlled circuit 210.

In the control device 100, a power supply potential Vcc is applied to the differential signal line W1, and a ground potential GND is applied to the differential signal line W2. As a result, the pair of differential signal lines W1 and W2 also function as power supply wirings, whereby power can be supplied to a load circuit 230 included in the controlled device 200.

In such a circuit configuration, the differential mode filter 11 can be applied to the control device 100 and controlled device 200. That is, in the control device 100, the differential mode filter 11 is inserted between the pair of differential signal lines W1 and W2 and a pair of power supply Vcc and GND wire ends, while in the controlled device 200, the differential mode filter 11 is inserted between the pair of differential signal lines W1 and W2 and the load circuit 230. This makes it possible to prevent the differential signal from flowing in the power supply Vcc, GND, and load circuit 230 to thereby allow passage of only a DC voltage component.

Figure 5:
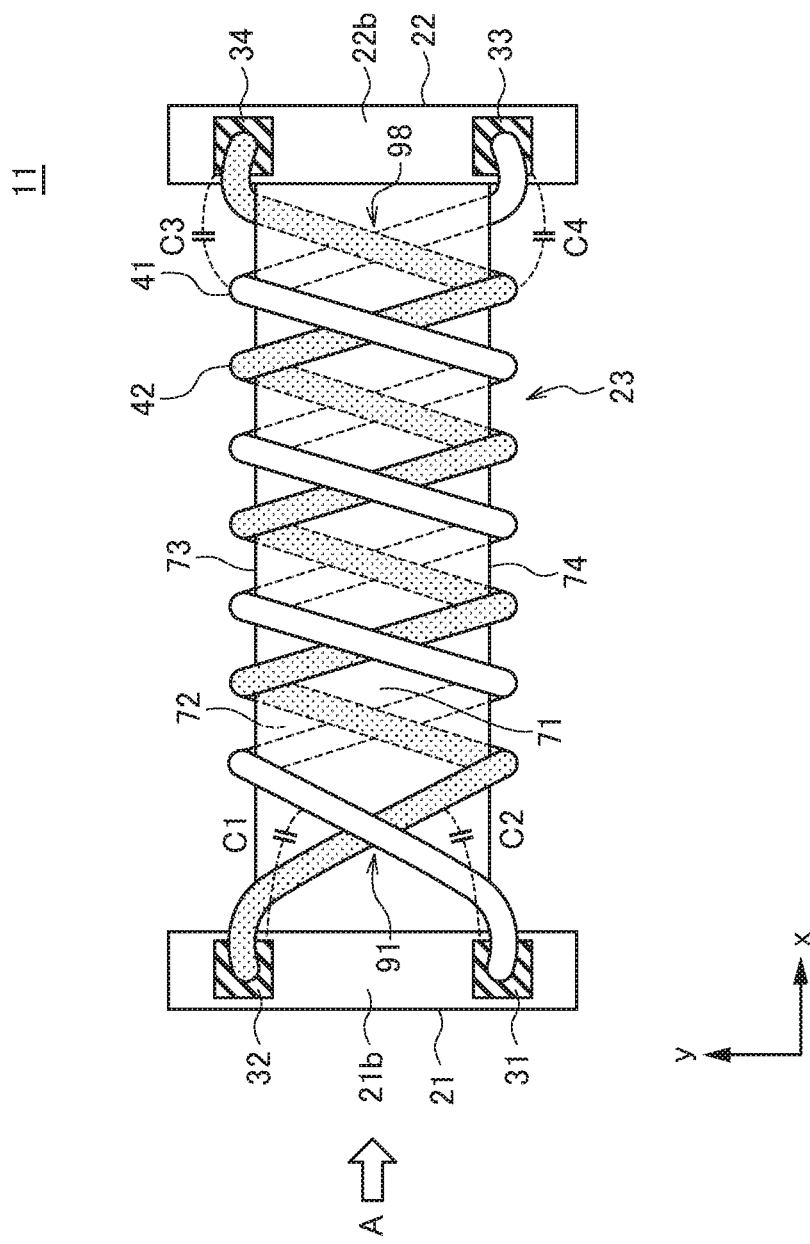
FIGS. 5 and 6 are views for explaining a winding layout of the first and second wires.
Figure 6:
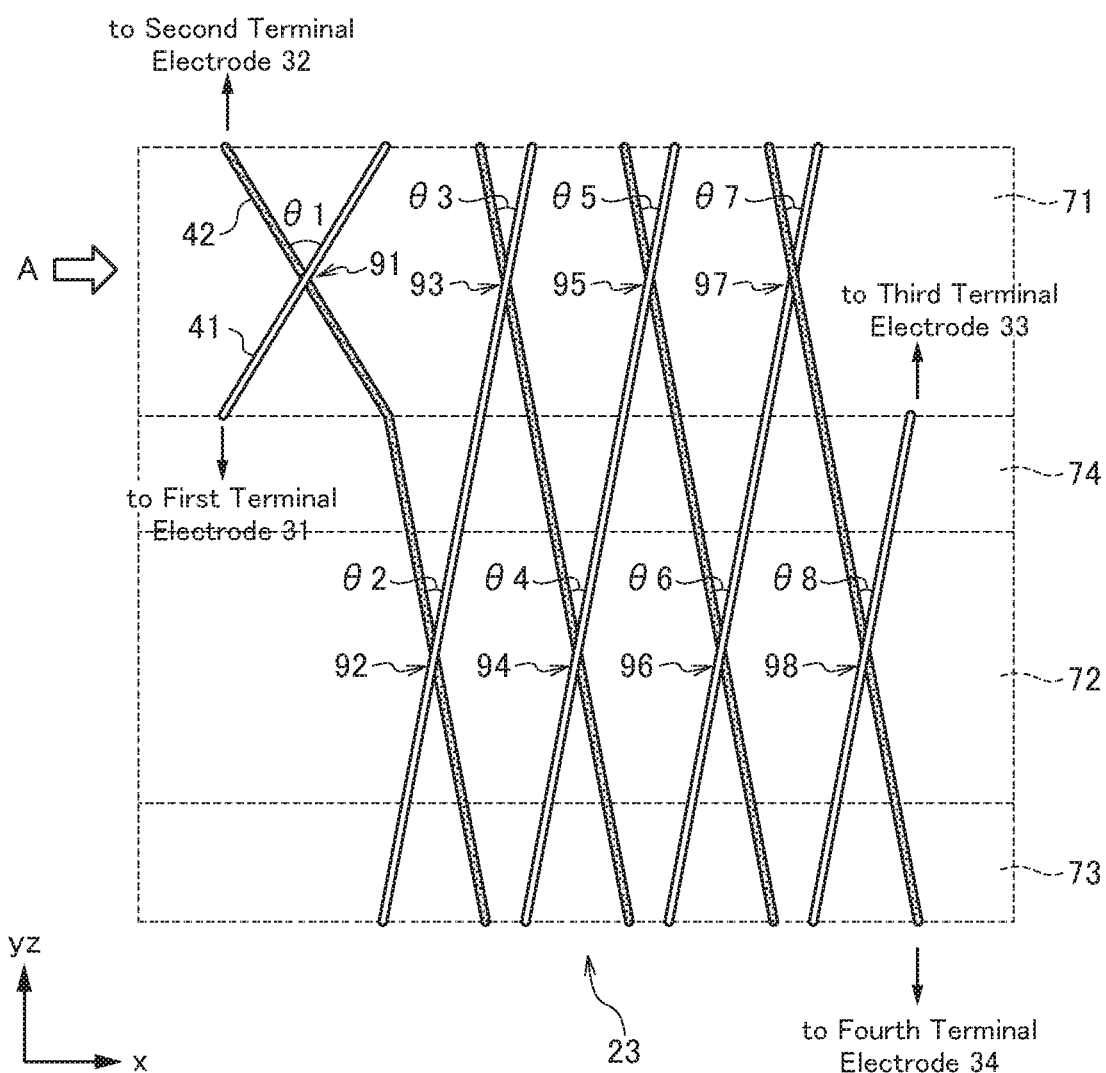

FIGS. 5 and 6 are views for explaining the winding layout of the first and second wires 41 and 42. FIG. 5 is a schematic view, and FIG. 6 is a developed view.

As illustrated in FIGS. 5 and 6, when viewed in the direction of the arrow A, the first wire 41 is wound left handed (counterclockwise) from the first terminal electrode 31 to third terminal electrode 33 in four turns, while the second wire 42 is wound right handed (clockwise) from the second terminal electrode 32 to the fourth terminal electrode 34 in four turns. It follows that the first and second wires 41 and 42 cross each other a plurality of times on the winding core part 23.

More specifically, the winding core part 23 has a substantially quadrangular shape in cross section (yz cross section) perpendicular to the axial direction thereof and thus has four winding surfaces 71 to 74 extending in the axial direction. The substantially quadrangular shape in this embodiment does not necessarily refer to a perfect quadrangle. For example, the corners of the quadrangle may be rounded, or the sides constituting the quadrangle may be curved in a convex manner.

The first winding surface 71 constitutes the xy plane and positioned on the side opposite the plate core 24. As illustrated in FIGS. 5 and 6, on the first winding surface 71, the first and second wires 41 and 42 cross each other a plurality of times. In the present embodiment, the first and second wires 41 and 42 form four cross points 91, 93, 95, 97 on the first winding surface 71. Although not particularly limited, in the present embodiment, the first wire 41 and second wire 42 cross each other on the first winding surface 71 in such a way that the first wire 41 overlies the second wire 42.

The second winding surface 72 constitutes the xy plane and faces the plate core 24. As illustrated in FIGS. 5 and 6, on the second winding surface 72 as well, the first and second wires 41 and 42 cross each other a plurality of times. In the present embodiment, the first and second wires 41 and 42 form four cross points 92, 94, 96, 98 on the second winding surface 72. Although not particularly limited, in the present embodiment, the first wire 41 and second wire 42 cross each other on the second winding surface 72 in such a way that the first wire 41 overlies the second wire 42.

The third and fourth winding surfaces 73 and 74 each constitute an xz plane on which the first and second wires 41 and 42 do not cross each other. In the present embodiment, the first and second winding surfaces 71 and 72 have areas larger than those of the third and fourth winding surfaces 73 and 74. Corners serving as the boundaries between the first winding surface 71 and the third and fourth winding surfaces 73 and 74 and corners serving as the boundaries between the second winding surface 72 and the third and fourth winding surfaces 73 and 74 each play a role of fixing the positions of the first and second wires 41 and 42. That is, by forming the cross-sectional shape of the winding core part into a substantially quadrangular shape having corners, it is possible to prevent displacement of the first and second wires 41 and 42 after winding, as compared to the case when the cross-sectional shape of the winding core part is formed into a circular shape or ellipsoidal shape.

As illustrated in FIG. 6, a crossing angle $\theta 1$ between the first and second wires 41 and 42 at the first crossing portion 91 of all the crossing portions 91 to 98 counting from the side of the first and second terminal electrodes 31 and 32 (one end sides of the first and second wires 41 and 42) is larger than crossing angles $\theta 2$ to $\theta 8$ at the respective crossing portions 92 to 98 ($\theta 1 > \theta 2$ to $\theta 8$). Although not particularly limited, the crossing angles $\theta 2$ to $\theta 8$ at the respective crossing portions 92 to 98 are substantially equal to each other.

Thus, as illustrated in FIG. 5, a capacitance component C1 between the first wire 41 and the second terminal electrode 32 and a capacitance component C2 between the second wire 42 and the first terminal electrode 31 are reduced. Such an effect can be obtained for the following reasons.

That is, as illustrated in FIG. 5, in the differential mode filter, the first and second wires 41 and 42 are wound in the opposite directions to each other. It follows that the first and second wires 41 and 42 are positioned on the first winding surface 71 at the first crossing portion 91 counting from the first flange part 21 side, while they are positioned on the second winding surface 72 at the first crossing portion 98 counting from the second flange part 22 side. The terminal electrodes 31 to 34 are provided on bottom surfaces 21b and 22b (first surfaces) facing the same direction as the first winding surface 71, so that the first wire 41 and the second terminal electrode 32 to which different potentials are applied are in close proximity to each other near the crossing portion 91, and second wire 42 and first terminal electrode 31 to which different potentials are applied are in close proximity to each other near the crossing portion 91. As a result, the capacitance components C1 and C2 are generated between the first wire 41 and the second terminal electrode 32 and between the second wire 42 and the first terminal electrode 31, respectively.

On the other hand, the distance between the first wire 41 near the crossing portion 98 and the fourth terminal electrode 34 is larger than the distance between the first wire 41 near the crossing portion 91 and the second terminal electrode 32, so that a capacitance component C3 generated between the first wire 41 and the fourth terminal electrode 34 is smaller than the capacitance component C1. Similarly, the distance between the second wire 42 near the crossing portion 98 and the third terminal electrode 33 is larger than the distance between the second wire 42 near the crossing portion 91 and the first terminal electrode 31, so that a capacitance component C4 generated between the second wire 42 and the third terminal electrode 33 is smaller than the capacitance component C2. This is because the first crossing portion 98 counting from the second flange part 22 side is positioned on the second winding surface 72.

Considering this point, in the present embodiment, the crossing angle $\theta 1$ at the crossing portion 91 is increased to reduce the capacitance components C1 and C2. Thus, the capacitance component C1 is reduced due to an increase in the distance between the first wire 41 and the second terminal electrode 32, and the capacitance component C2 is reduced due to an increase in the distance between the second wire 42 and the first terminal electrode 31.

Figure 7:
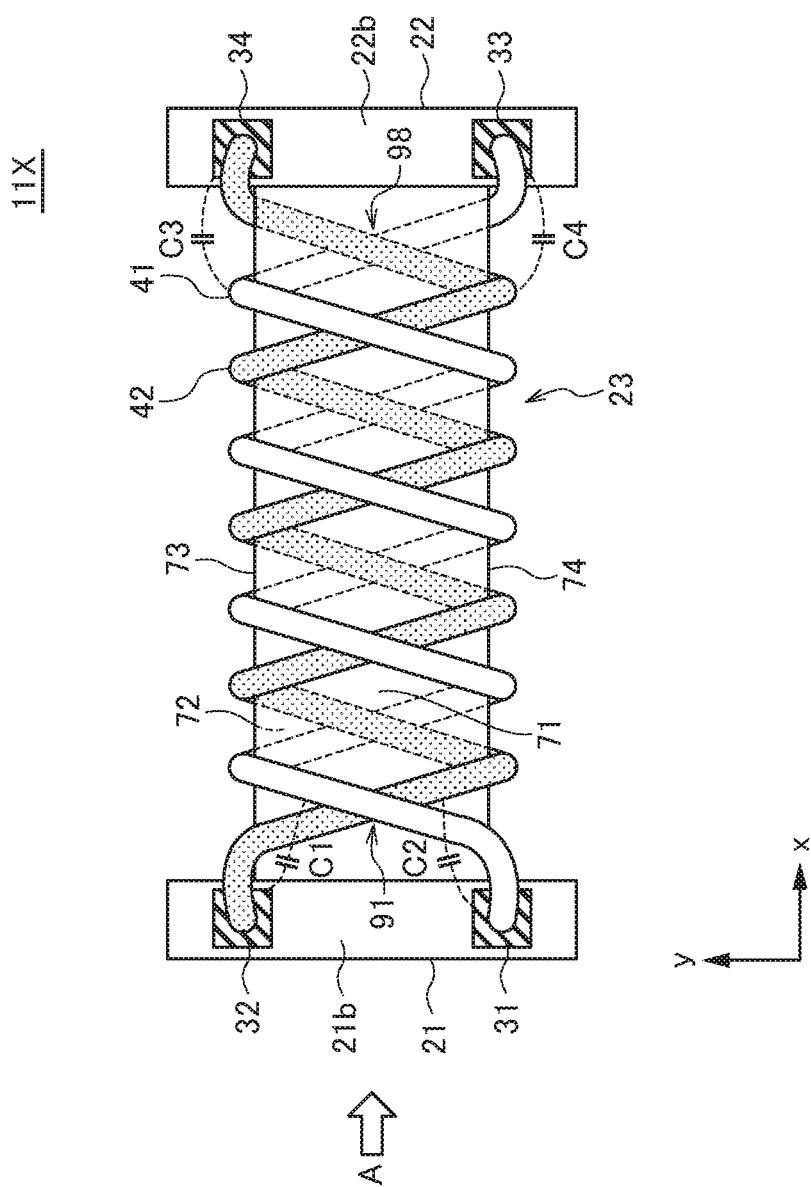
FIG. 7 is a schematic view for explaining the winding layout of a differential mode filter according to a first reference example.

FIG. 7 is a schematic view for explaining the winding layout of a differential mode filter 11X according to the first reference example, in which the crossing angles $\theta 1$ to $\theta 8$ are equal to each other.

In the differential mode filter 11X illustrated in FIG. 7, the crossing angles $\theta 1$ to $\theta 8$ are equal to each other, so that the distance between the first wire 41 and the second terminal electrode 32 and the distance between the second wire 42 and the first terminal electrode 31 become smaller, with the result that the capacitance components C1 and C2 are increased. On the other hand, in the differential mode filter 11 according to the present embodiment, the crossing angle $\theta 1$ is increased, so that the capacitance components C1 and C2 are reduced, whereby excellent high-frequency characteristics can be obtained.

When the crossing angles $\theta 2$ to $\theta 8$ at the respective crossing portions 92 to 98 are increased like the crossing angle $\theta 1$, the size of the core 20 in the axial direction (x-direction) is disadvantageously increased. Thus, in the present embodiment, the crossing angles $\theta 2$ to $\theta 8$ at the respective crossing portions 92 to 98 are reduced, while the crossing angle $\theta 1$ at the crossing portion 91 is increased, thereby improving high-frequency characteristics while preventing an increase in the size of the core 20.

However, a certain degree of variations may occur in the winding positions of the first and second wires 41 and 42, so that it is difficult to make the crossing angles $\theta 2$ to $\theta 8$ completely coincide with each other. Considering this point, the crossing angle $\theta 1$ may not necessarily be larger than any of the crossing angles $\theta 2$ to $\theta 8$, but some of the crossing angles $\theta 2$ to $\theta 8$ may be equal to or larger than the crossing angle $\theta 1$. Also in this case, the crossing angle $\theta 1$ at the crossing portion 91 needs to be larger than the average value of the crossing angles at the crossing portions 92 to 98.

Further, the number of turns of each of the first and second wires 41 and 42 is not limited, and two turns will suffice. The relationship between the number T of turns and the number X of crossing times in the differential mode filter is X=2T. Thus, the number X of crossing times is 4 in the two-turn configuration. Considering the number of turns in addition to the variations in the winding positions, it is sufficient that the crossing angle $\theta 1$ at the first crossing portion 91 is larger than at least one of the crossing angles $\theta 2$ and $\theta 3$ at the respective second and third crossing portions 92 and 93. Further, considering miniaturization of the core 20, the crossing angle $\theta 1$ at the first crossing portion 91 is preferably larger than both the crossing angles $\theta 2$ and $\theta 3$ at the respective second and third crossing portions 92 and 93.

As described above, in the differential mode filter 11 according to the present embodiment, the crossing angle θ1 at the crossing portion 91 closest to the first and second terminal electrodes 31 and 32 is larger than the crossing angles θ2 to θ8 at the other respective crossing portions 92 to 98, so that it is possible to obtain excellent high-frequency characteristics more than ever while preventing an increase in the size of the core 20.

<Second Embodiment>

Figure 8:
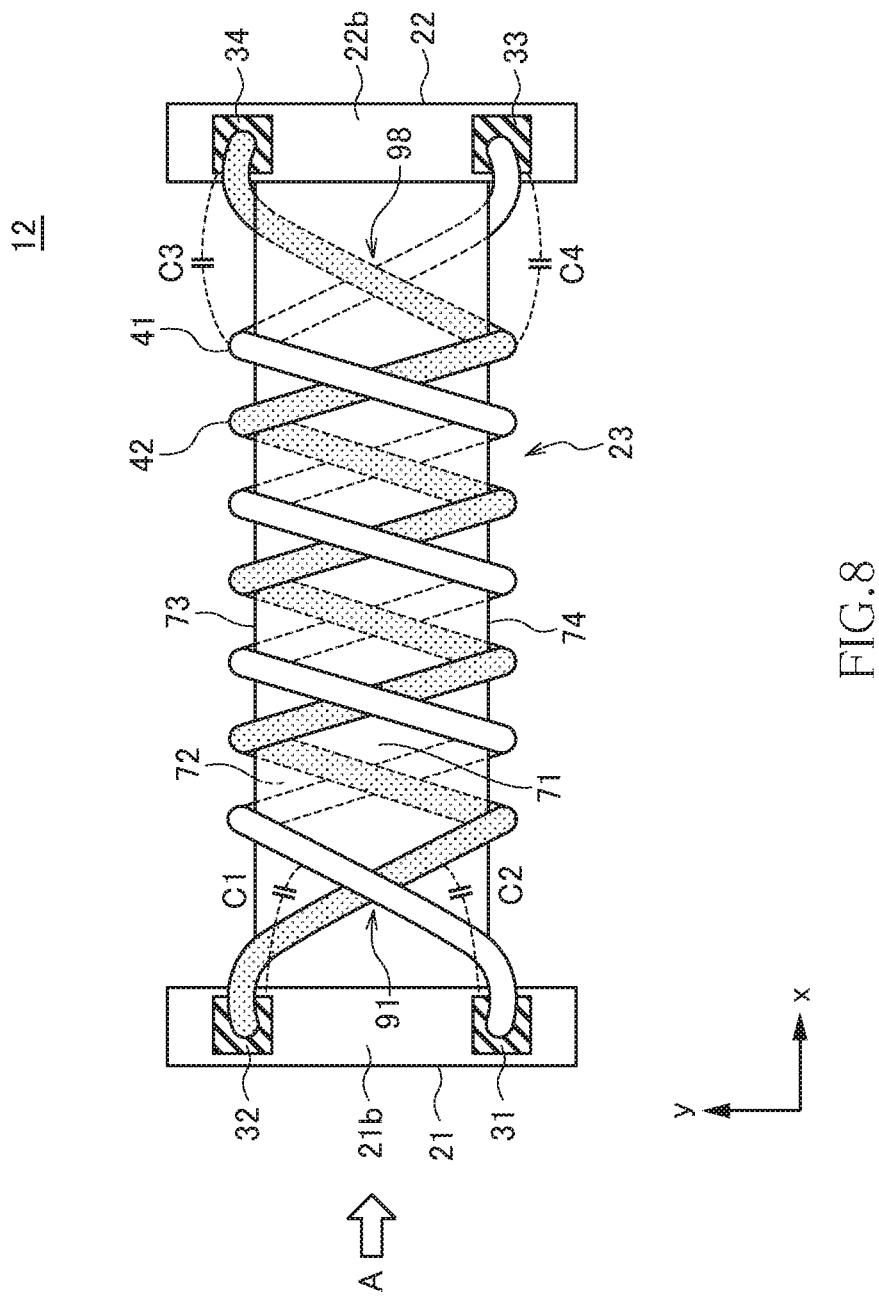
FIG. 8 is a schematic view for explaining the structure of a differential mode filter according to a second embodiment of the present invention.
Figure 9:
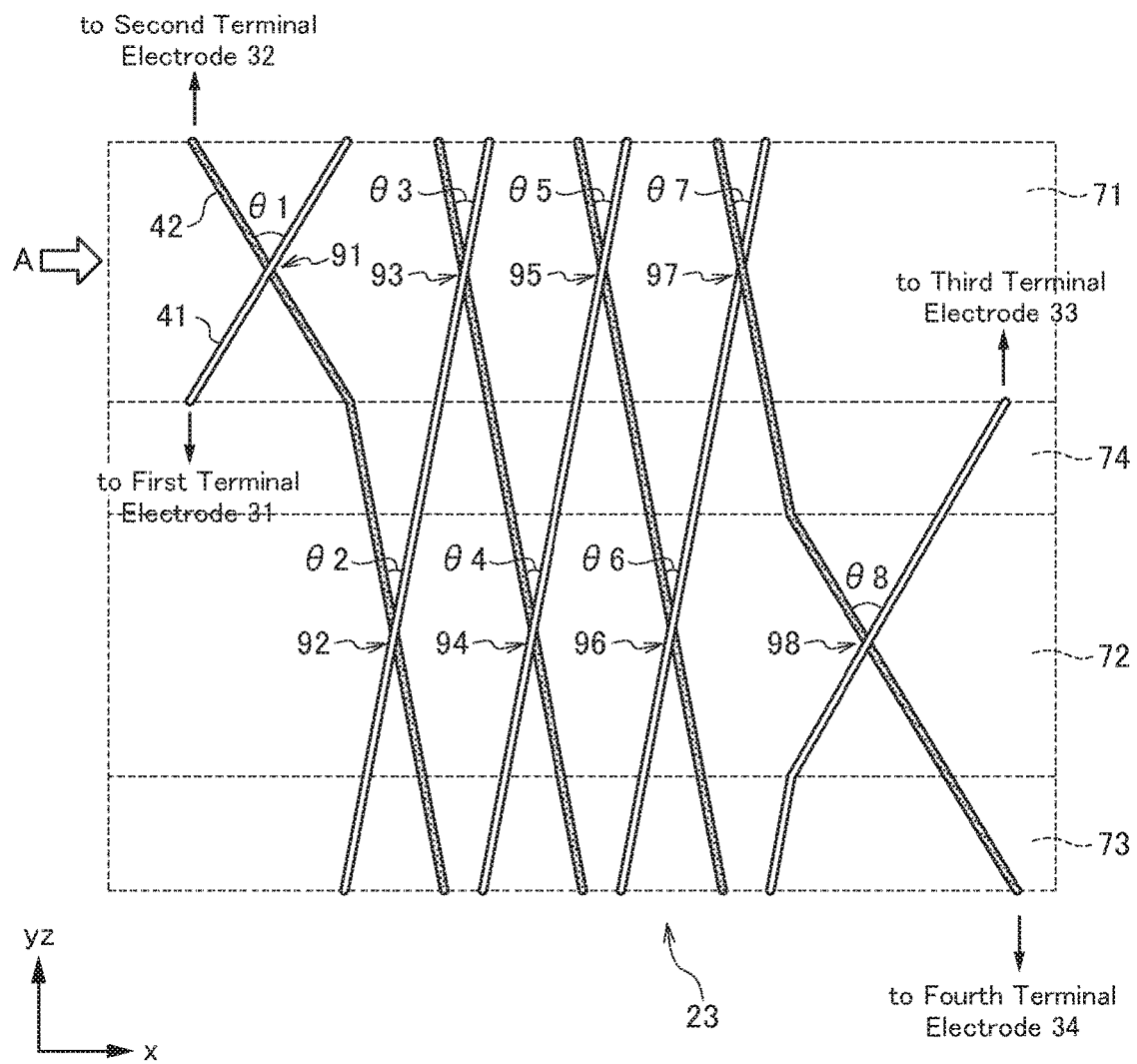
FIG. 9 is a developed view for explaining the structure of a differential mode filter according to the second embodiment of the present invention.

FIGS. 8 and 9 are views for explaining the structure of a differential mode filter 12 according to the second embodiment. Specifically, FIGS. 8 and 9 are a schematic view and a developed view, respectively, for explaining the winding layout of the first and second wires 41 and 42.

The differential mode filter 12 according to the present embodiment differs from the differential mode filter 11 according to the first embodiment in that not only the crossing angle θ1 at the first crossing portion 91 counting from the side of the first and second terminal electrodes 31 and 32, but also the crossing angle θ8 at the first crossing portion 98 counting from the side of the third and fourth terminal electrodes 33 and 34 is increased. Other configurations are the same as those of the differential mode filter 11 according to the first embodiment, so the same reference numerals are given to the same elements, and overlapping description will be omitted.

As described above, in the differential mode filter 12 according to the present embodiment, the crossing angles θ1 and θ8 at the respective crossing portions 91 and 98 at both ends of the winding core 23 are increased (θ1, θ8>θ2 to θ7). Although not particularly limited, the crossing angles θ2 to θ7 at the respective crossing portions 92 to 97 are substantially equal to each other.

Thus, in the present embodiment, not only the capacitance components C1 and C2, but also the capacitance components C3 and C4 are reduced, so that more excellent high-frequency characteristics can be obtained.

However, as described above, a certain degree of variations may occur in the winding positions of the first and second wires 41 and 42, so that it is difficult to make the crossing angles θ2 to θ7 completely coincide with each other. Considering this point, while the crossing angles θ1 and θ8 may not necessarily be larger than any of the crossing angles θ2 to θ7, some of the crossing angles θ2 to θ7 may be equal to or large than the crossing angles θ1 or θ8. Also in this case, the crossing angles θ1 and θ8 at the respective crossing portions 91 and 98 need to be larger than the average value of the crossing angles at the crossing portions 92 to 97.

As described above, in the differential mode filter 12 according to the present embodiment, the capacitance components C1 to C4 are reduced, so that more improved high-frequency characteristics can be obtained.

<Third Embodiment>

Figure 10:
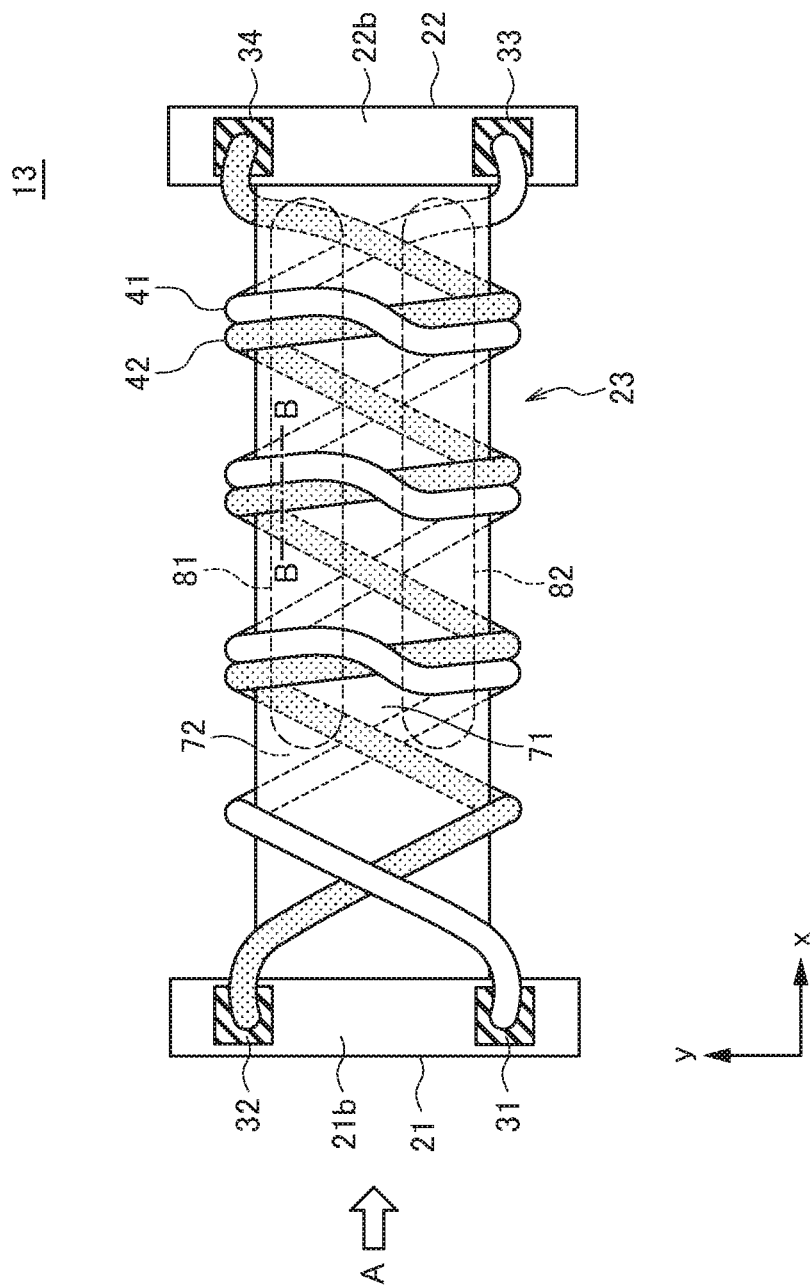
FIG. 10 is a schematic view for explaining the structure of a differential mode filter according to a third embodiment of the present invention.
Figure 11:
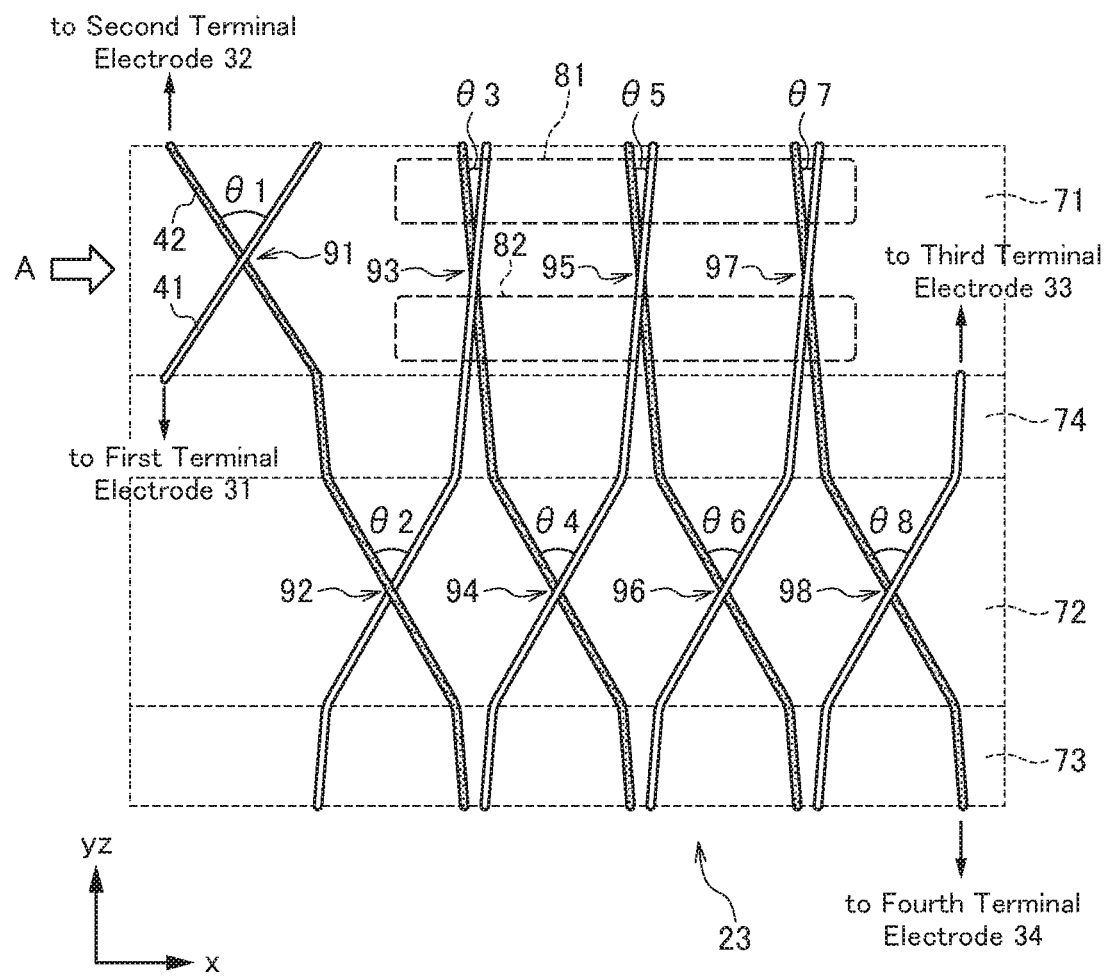
FIG. 11 is a developed view for explaining the structure of a differential mode filter according to the third embodiment of the present invention.

FIGS. 10 and 11 are views for explaining the structure of a differential mode filter 13 according to the third embodiment. Specifically, FIGS. 10 and 11 are a schematic view and a developed view, respectively, for explaining the winding layout of the first and second wires 41 and 42.

In the present embodiment, the crossing angles θ3, θ5, and θ7 at the respective crossing portions 93, 95, and 97 on the first winding surface 71 are reduced, while the crossing angle θ1 at the crossing portion 91 on the first winding surface 71 and the crossing angles θ2, θ4, θ6, and θ8 at the respective crossing portions 92, 94, 96, and 98 on the second winding surface 72 are increased (θ1, θ2, θ4, θ6, θ8>θ3, θ5, θ7). Other configurations are the same as those of the differential mode filter 11 according to the first embodiment, so the same reference numerals are given to the same elements, and overlapping description will be omitted.

Thus, the first and second wires 41 and 42 show a higher degree of parallelism on the first winding surface 71 except for a vicinity of the crossing portion 91 than on the second winding surface 72. As a result, a section in which the first and second wires 41 and 42 contact each other is longer on the first winding surface 71 than on the second winding surface 72. Particularly, in the present embodiment, the first and second wires 41 and 42 contact each other in the axial direction (x-direction) on the first winding surface 71, while they do not contact each other in the axial direction (x-direction) on the second winding surface 72.

Specifically, as illustrated in FIGS. 10 and 11, when a half of the first winding surface 71 in the y-direction is defined as a first region 81, and the other half thereof is as a second region 82, the positional relationship between the first and second wires 41 and 42 in the first region 81 and that between the first and second wires 41 and 42 in the second region 82 are opposite each other. That is, in the first region 81, the first and second wires 41 and 42 are positioned on the first flange part 21 side and the second flange part 22 side, respectively; while in the second region 82, the first and second wires 41 and 42 are positioned on the second flange part 22 side and the first flange part 21 side, respectively.

Figure 12:
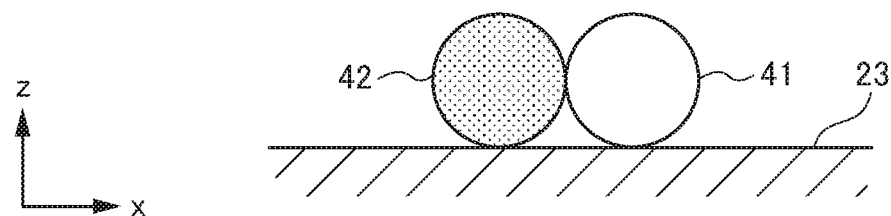
FIG. 12 is a cross-sectional view taken along line B-B in FIG. 10.

Further, in the present embodiment, the first and second wires 41 and 42 contact each other in the axial direction both in the first and second regions 81 and 82. That is, as illustrated in FIG. 12 which is a cross-sectional view taken along line B-B in FIG. 10, before and after the first and second wires 41 and 42 cross each other, there is a section where both of them contact the first winding surface 71 and run along each other. As illustrated in FIG. 10, to make the first and second wires 41 and 42 contact in the axial direction, the wire on the upper side (first wire 41) is slightly bent downward (to the second wire 42 side) before and after the first and second wires 41 and 42 cross each other to make them run along each other.

This makes it easy to wind one wire based on the other wire, thereby suppressing variation in the winding position. The first and second wires 41 and 42 may be made to contact each other in only one of the first and second regions 81 and 82; however, variation in the winding position can be suppressed more reliably when they are made to contact each other in both the first and second regions 81 and 82.

On the other hand, on the second winding surface 72, the first and second wires 41 and 42 contact each other only at cross portions 92, 94, 96, and 98 where they cross each other. That is, on the second winding surface 72, the first and second wires 41 and 42 do not contact each other in the axial direction. Thus, since the crossing angles θ2, θ4, θ6, and θ8 are large on the second winding surface 72, both the first and second wires 41 and 42 can ensure a large transition amount in the x-direction.

As described above, in the differential mode filter according to the present embodiment, by making the crossing angles θ3, θ5, and θ7 between the first and second wires 41 and 42 small on the first winding surface 71, the first and second wires 41 and 42 are made to contact each other in the axial direction on the first winding surface 71. This facilitates the winding of one wire based on the other wire, suppressing variation in the winding position, thus enabling high-frequency characteristics to be enhanced.

Also in the differential mode filter 13 according to the present embodiment, the crossing angle θ1 at the crossing portion 91 closest to the first flange part 21 is increased, so that the capacitance components C1 and C2 are reduced as in the differential mode filter 11 according to the first embodiment.

Figure 13:
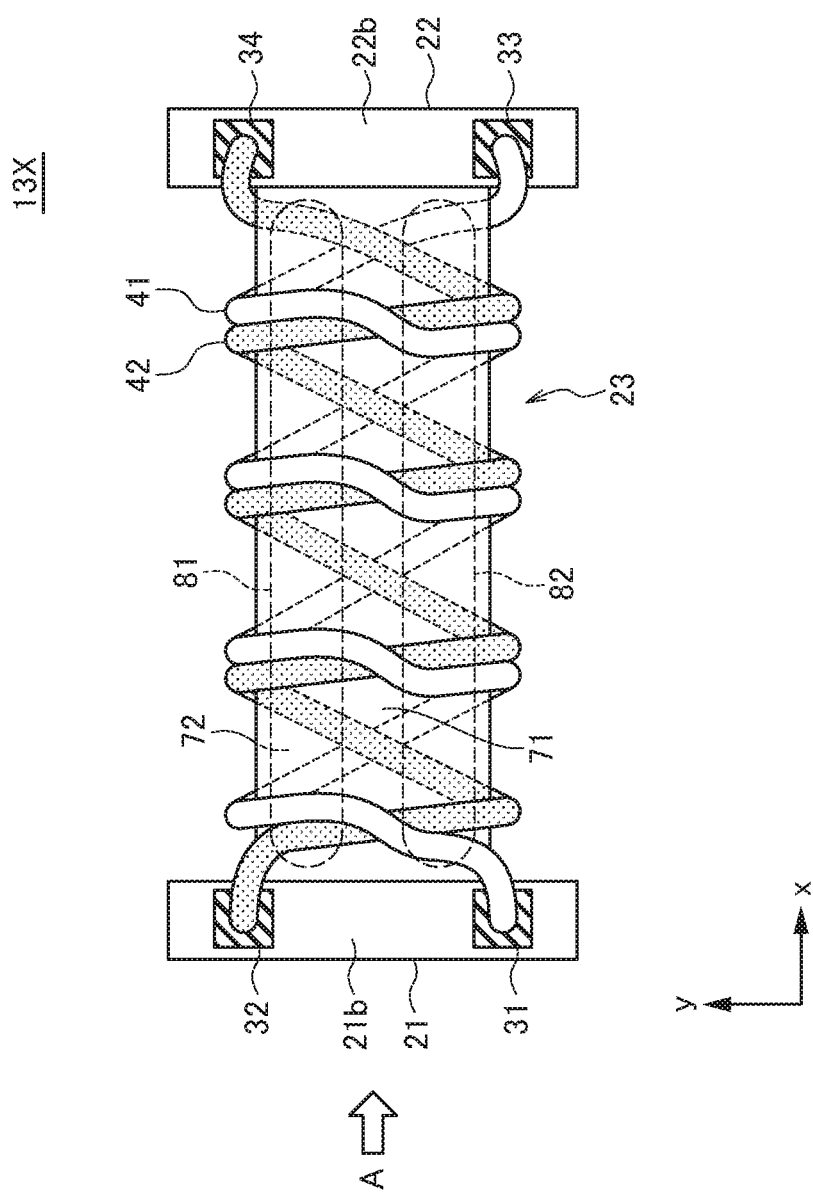
FIG. 13 is a schematic view for explaining the winding layout of a differential mode filter according to a second reference example.

FIG. 13 is a schematic view for explaining the winding layout of a differential mode filter 13X according to the second reference example.

The differential mode filter 13X according to the reference example differs from the differential mode filter 13 according to the third embodiment in that the crossing angle θ1 at the crossing portion 91 is equal to the crossing angles θ3, θ5, and θ7 at the respective crossing portions 93, 95, and 97. Although variations in the winding positions can be suppressed also in this configuration, the capacitance components C1 and C2 are increased since the crossing angle θ1 at the crossing portion 91 is small.

Figure 14:
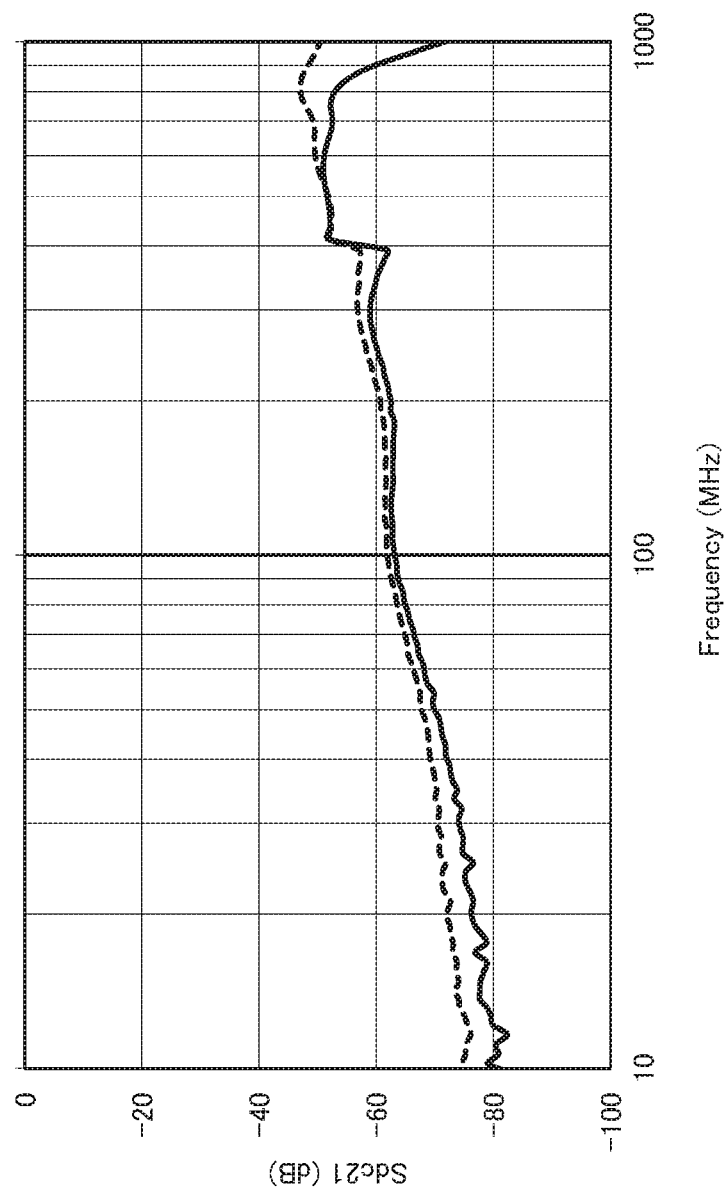
FIG. 14 is a graph illustrating high-frequency characteristics of the differential mode filter according to the third embodiment and high-frequency characteristics of the differential mode filter according to the second reference example.

FIG. 14 is a graph illustrating high-frequency characteristics of the differential mode filter 13 according to the third embodiment and high-frequency characteristics of the differential mode filter 13X according to the reference example.

The high-frequency characteristic illustrated in FIG. 14 is called Sdc21. The Sdc21 is a passage characteristic indicating the rate at which a common mode signal is converted into a differential signal. As illustrated in FIG. 14, in the differential mode filter 13 (continuous line) according to the present embodiment, the value of the Sdc21 is suppressed over substantially the entire bandwidth from 10 MHz to 1000 MHz, and thus more improved high-frequency characteristics than those in the differential mode filter 13X (dashed line) according to the second reference example can be obtained.

<Fourth Embodiment>

Figure 15:
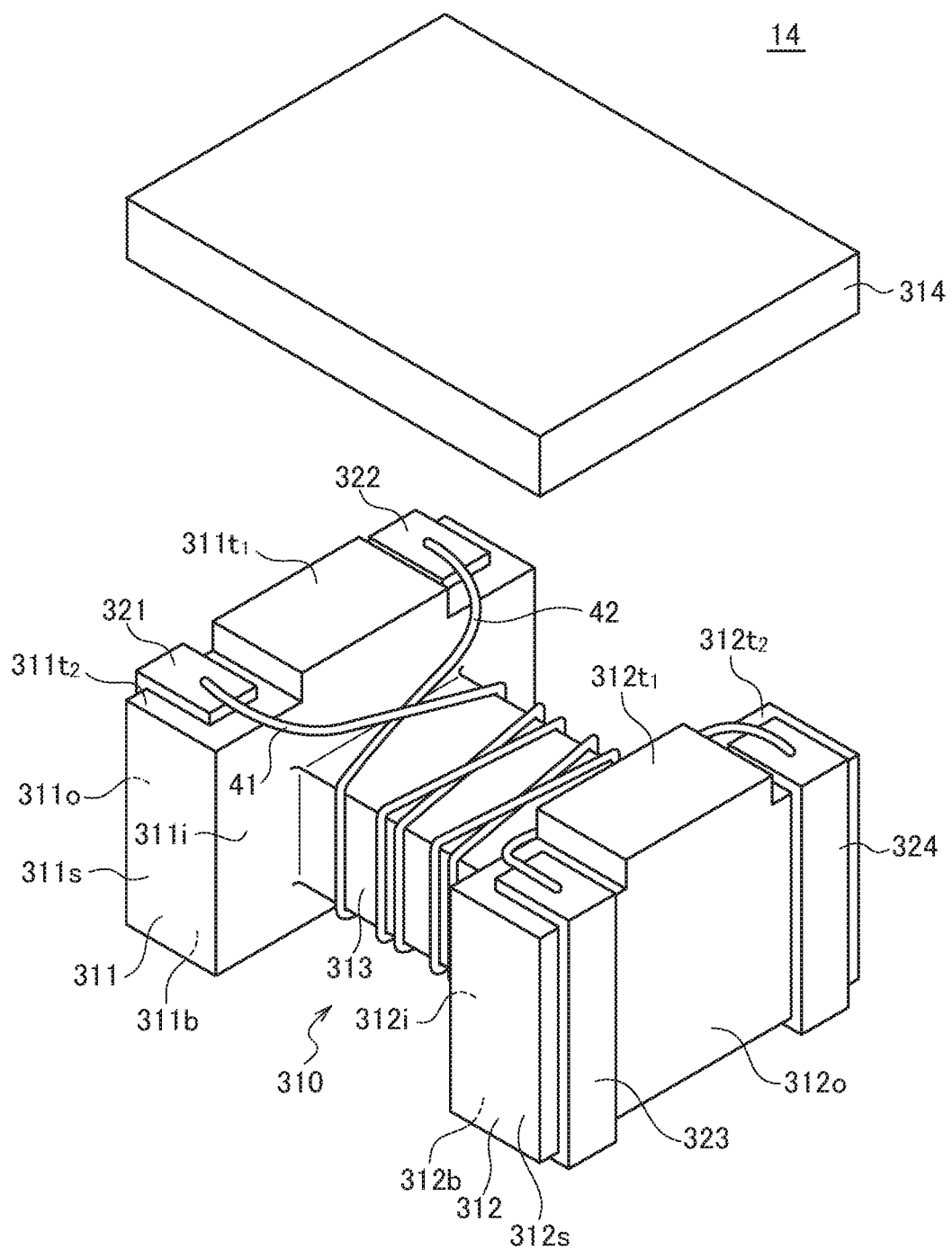
FIG. 15 is an exploded perspective view of a differential mode filter according to a fourth embodiment of the present invention as viewed from the upper surface side.
Figure 16:
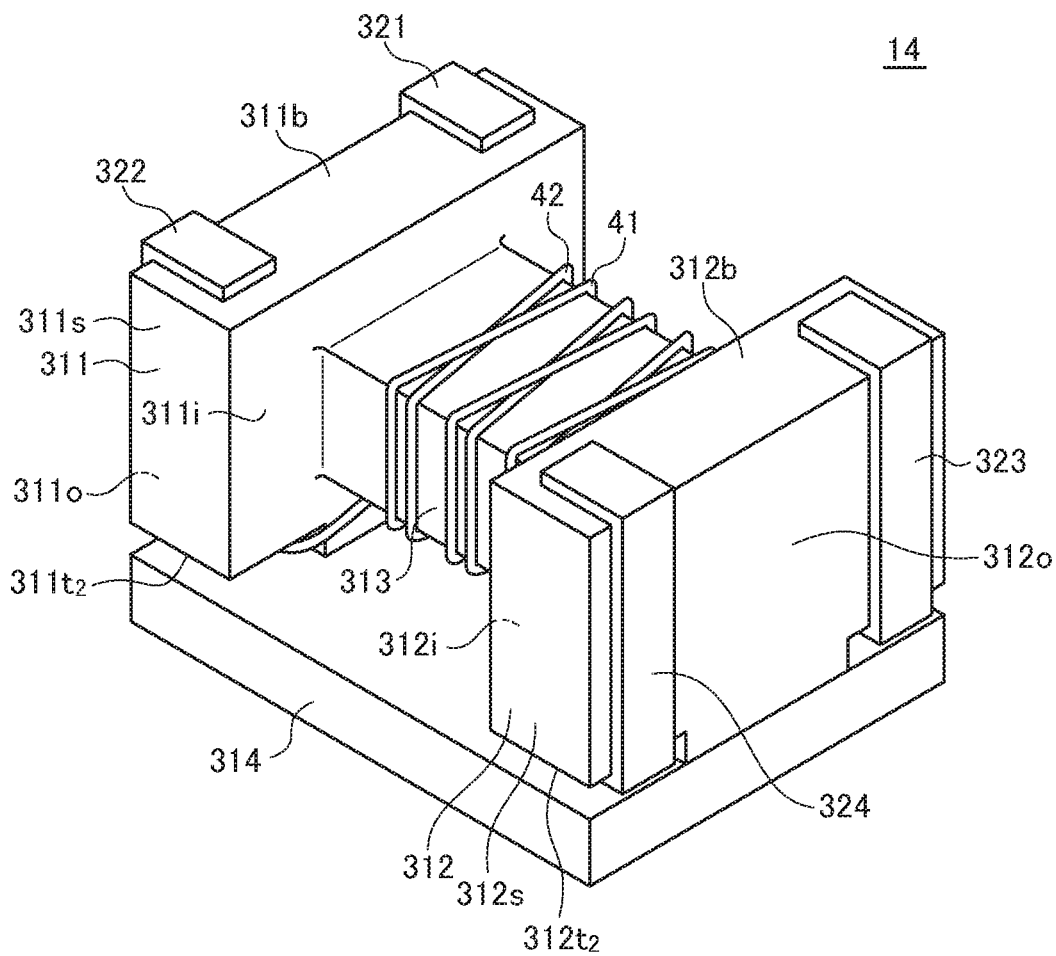
FIG. 16 is a perspective view of the differential mode filter according to the fourth embodiment of the present invention as viewed from the mounting surface side.

FIG. 15 is an exploded perspective view of a differential mode filter 14 according to the fourth embodiment as viewed from the upper surface side. FIG. 16 is a perspective view of the differential mode filter 14 according to the fourth embodiment as viewed from the mounting surface side.

As illustrated in FIGS. 15 and 16, the differential mode filter 14 according to the present embodiment differs from the differential mode filter 11 according to the first embodiment in the shapes of the core and terminal electrode. Specifically, the differential mode filter 14 according to the present embodiment has a drum core 310, a plate core 314, first to fourth terminal electrodes 321 to 324, and first and second wires 41 and 42 wound in opposite directions to each other.

The core 310 has a first flange part 311, a second flange part 312, and a winding core part 313 disposed between the first and second flange parts 311 and 312. The winding core part 313 has its axis direction in the x-direction. The first and second flange parts 311 and 312 are disposed at both ends of the winding core part 313 in the axial direction and integrally formed with the winding core part 313. The first flange part 311 has an inner side surface 311$i$ connected to the winding core part 313, an outer side surface 311$o$ positioned on the side opposite to the inner side surface 311$i$, a top surface 311$t$ to which the plate core 314 is bonded, a bottom surface 311$b$ positioned on the side opposite to the top surface 311$t$, and side surfaces 311$s$ positioned on opposite sides to each other. The inner side surface 311$i$ and the outer side surface 311$o$ each constitute the yz plane, the top surface 311$t$ and the bottom surface 311$b$ each constitute the xy plane, and the side surfaces 311$s$ each constitute the xz plane. Similarly, the second flange part 312 has an inner side surface 312$i$ and an outer side surface 312$o$ each constituting the yz plane, a top surface 312$t$ and a bottom surface 312$b$ each constituting the xy plane, and two side surfaces 312$s$ each constituting the xz plane.

As illustrated in FIG. 15, the top surfaces 311$t$ and 312$t$ each have a step. Specifically, the top surface 311$t$ has an upper stage surface 311$t_1$ and a lower stage surface 311$t_2$, and the top surface 312$t$ has an upper stage surface 312$t_1$ and a lower stage surface 312$t_2$. The plate core 314 is bonded to the upper stage surfaces 311$t_1$ and 312$t_1$. Thus, a gap is formed between the plate core 314 and the lower stage surfaces 311$t_2$, 312$t_2$, and a part of each of the terminal electrodes 321 to 324 is disposed in the gap.

The first and second terminal electrodes 321 and 322 are disposed so as to cover the lower stage surface 311$t_2$, outer side surface 311$o$, and bottom surface 311$b$ of the first flange part 311, and the third and fourth terminal electrodes 323 and 324 are disposed so as to cover the lower stage surface 312$t_2$, outer side surface 312$o$, and bottom surface 312$b$ of the second flange part 312.

The winding layout of the first and second wires 41 and 42 is the same as the winding layout described using FIGS. 8 and 9 (θ1, θ8>θ2 to θ7).

In the present embodiment, the terminal electrodes 321 to 324 are provided not only on the bottom surfaces 311$b$ and 312$b$ of the respective flange pars, but also on the top surfaces 311$t$ and 312$t$ (second surfaces) facing the same direction as the second winding surface, so that the capacitance components C3 and C4 are likely to be increased as compared to those in the above-described differential mode filters 11, 12, and 13. This is because the first wire 41 and the fourth terminal electrode 324 are in close proximity to each other near the top surface 312$t$ of the second flange part 312, and so are the second wire 42 and the third terminal electrode 323.

Nonetheless, in the differential mode filter 14 according to the present embodiment, the crossing angles θ1 and θ8 at the respective crossing portions 91 and 98 are increased as illustrated in FIG. 8 and FIG. 9, so that not only the capacitance components C1 and C2, but also the capacitance components C3 and C4 are reduced. Thus, by reducing the capacitance components C3 and C4 that are likely to be increased, excellent high-frequency characteristics can be obtained.

While the preferred embodiments of the present invention have been described, the present invention is not limited thereto. Thus, various modifications may be made without departing from the gist of the invention, and all of the modifications thereof are included in the scope of the present invention.

For example, although each of the differential mode filters 11 to 14 according to the above respective embodiments has a configuration where the four terminal electrodes 31 to 34 are bonded to the core 20, the terminal electrodes 31 to 34 may be directly formed on the core 20 by using a conductive paste or the like.

What is claimed is:
1. A differential mode filter comprising:
a core having a winding core part extending in an axial direction and a first flange part provided at one end of the winding core part in the axial direction;
first and second terminal electrodes provided on the first flange part;
a first wire wound around the winding core part in a first winding direction and having one end connected to the first terminal electrode; and a second wire wound around the winding core part in a second winding direction opposite to the first winding direction and having one end connected to the second terminal electrode, wherein the first and second wires cross each other on the winding core part to form a plurality of crossing portions that include first, second, and third crossing portions that are first, second, and third occurrences counting from the one end of the first and second wires, respectively, and wherein a first crossing angle between the first and second wires at the first crossing portion is larger than at least one of second and third crossing angles between the first and second wires at the second and third portions, respectively, and wherein each of the first, second and third crossing angles is less than 90 degrees.

2. The differential mode filter as claimed in claim 1, wherein the first crossing angle is larger than both the second and third crossing angles.

3. The differential mode filter as claimed in claim 1, wherein the winding core part has a first winding surface, wherein the first flange part has a first surface facing a same direction as the first winding surface, wherein the first and second terminal electrodes are formed on at least the first surface of the first flange part, and wherein the first crossing portion is positioned on the first winding surface.

4. The differential mode filter as claimed in claim 3, wherein the winding core part further has a second winding surface opposite to the first winding surface, wherein the second crossing portion is positioned on the second winding surface of the winding core part, wherein the third crossing portion is positioned on the first winding surface of the winding core part, and wherein the second crossing angle is different from the third crossing angle.

5. The differential mode filter as claimed in claim 4, wherein the first and second wires contact each other in the axial direction on one of the first and second winding surfaces.

6. The differential mode filter as claimed in claim 3, wherein the core further has a second flange part provided at another end of the winding core part in the axial direction, wherein the second flange part is provided with a third terminal electrode connected with another end of the first wire and a fourth terminal electrode connected with another end of the second wire, wherein the plurality of crossing portions further include fourth, fifth, and sixth crossing portions that are first, second, and third occurrences counting from the another end of the first and second wires, respectively, and wherein a fourth crossing angle between the first and second wires at the fourth crossing portion is larger than at least one of fifth and sixth crossing angles between the first and second wires at the fifth and sixth portions, respectively, and wherein each of the fourth, fifth and sixth crossing angles is less than 90 degrees.

7. The differential mode filter as claimed in claim 6, wherein the winding core part further has a second winding surface positioned opposite to the first winding surface, wherein the second flange part has a second surface facing a same direction as the second winding surface, and wherein the third and fourth terminal electrodes are formed on at least the second surface of the second flange part.

8. The differential mode filter as claimed in claim 3, wherein the winding core part further has a second winding surface opposite to the first winding surface, wherein the second crossing portion is positioned on the second winding surface of the winding core part, wherein the third crossing portion is positioned on the first winding surface of the winding core part, wherein the first winding surface has a first edge extending in the axial direction of the winding core part, wherein the second winding surface has a second edge extending in the axial direction of the winding core part, wherein the first crossing angle is an internal angle of a first triangle formed by the first wire, the second wire, and a first section of the first edge, wherein the second crossing angle is an internal angle of a second triangle formed by the first wire, the second wire, and the second edge, and wherein the third crossing angle is an internal angle of a third triangle formed by the first wire, the second wire, and a second section of the first edge.

9. The differential mode filter as claimed in claim 1, wherein the winding core part has a substantially quadrangular shape in a cross section perpendicular to the axial direction.

10. The differential mode filter as claimed in claim 1, wherein the first crossing angle is defined by a smallest angle between the first and second wires at the first crossing portion, wherein the second crossing angle is defined by a smallest angle between the first and second wires at the second crossing portion, and wherein the third crossing angle is defined by a smallest angle between the first and second wires at the third crossing portion.

11. A differential mode filter comprising:

a core having a winding core part extending in an axial direction, a first flange part provided at one end of the winding core part in the axial direction, and a second flange part provided at another end of the winding core part in the axial direction;

first and second terminal electrodes provided on the first flange part;

third and fourth terminal electrodes provided on the second flange part;

a first wire wound around the winding core part in a first winding direction and having one end and another end connected to the first and third terminal electrodes, respectively; and a second wire wound around the winding core part in a second winding direction opposite to the first winding direction and having one end and another end connected to the second and fourth terminal electrodes, respectively, wherein the first and second wires cross each other on the winding core part to form a plurality of crossing portions that include first, second, and a plurality of third crossing portions, the first crossing portion being a first occurrence counting from the one end of the first and second wires, the second crossing portion being a first occurrence counting from the another end of the first and second wires, the third crossing portions being positioned between the first crossing portion and the second crossing portion, wherein at least one of a first crossing angle between the first and second wires at the first crossing portion and a second crossing angle between the first and second wires at the second crossing portion is larger than an average value of third crossing angles between the first and second wires at the third crossing portions, and wherein each of the first, second and third crossing angles is less than 90 degrees.

12. The differential mode filter as claimed in claim 11, wherein the at least one of the first and second crossing angles is larger than any one of the third crossing angles.

13. The differential mode filter as claimed in claim 12, wherein both the first and second crossing angles are larger than any one of the third crossing angles.

14. The differential mode filter as claimed in claim 11, wherein both the first and second crossing angles are larger than the average value of the third crossing angles.

15. A differential mode filter comprising:
a core having a winding core part extending in an axial direction, a first flange part provided at one end of the winding core part in the axial direction, and a second flange part provided at another end of the winding core part in the axial direction;
first and second terminal electrodes provided on the first flange part;
third and fourth terminal electrodes provided on the second flange part;
a first wire wound around the winding core part in a first winding direction and having one end and another end connected to the first and third terminal electrodes, respectively; and
a second wire wound around the winding core part in a second winding direction opposite to the first winding direction and having one end and another end connected to the second and fourth terminal electrodes, respectively,
wherein the first and second wires cross each other on the winding core part to form a plurality of crossing portions that include first and second crossing portions, the first crossing portion being a first occurrence counting from the one end of the first and second wires, the second crossing portion being a first occurrence counting from the another end of the first and second wires,
wherein a first crossing angle between the first and second wires at the first crossing portion is larger than a second crossing angle between the first and second wires at the second crossing portion, and
wherein each of the first and second crossing angles is less than 90 degrees.

16. The differential mode filter as claimed in claim 15, wherein the winding core part has a first winding surface, wherein the first flange part has a first surface facing a same direction as the first winding surface,
wherein the first and second terminal electrodes are formed on at least the first surface of the first flange part, and
wherein the first crossing portion is positioned on the first winding surface.

17. The differential mode filter as claimed in claim 16, wherein the winding core part further has a second winding surface opposite to the first winding surface, and
wherein the second crossing portion is positioned on the second winding surface of the winding core part.

18. The differential mode filter as claimed in claim 17, wherein the second flange part has a second surface facing a same direction as the first winding surface, and
wherein the third and fourth terminal electrodes are formed on at least the second surface of the second flange part.

19. The differential mode filter as claimed in claim 18, wherein the second flange part further has a third surface opposite to the second surface, and
wherein the third surface is free from the third and fourth terminal electrodes.

20. The differential mode filter as claimed in claim 19, further comprising a plate core adhered to the third surface of the second flange part.

* * * * *

UNITED STATES PATENT AND TRADEMARK OFFICE
CERTIFICATE OF CORRECTION

PATENT NO. : 10,389,328 B2
APPLICATION NO. : 15/723392
DATED : August 20, 2019
INVENTOR(S) : Tsutomu Kobayashi et al.

Page 1 of 1

It is certified that error appears in the above-identified patent and that said Letters Patent is hereby corrected as shown below:

On the Title Page

Item (30), Foreign Application Priority Data should read:
Oct. 05, 2016    [JP] 2016-196900

Signed and Sealed this
Fifth Day of May, 2020

Andrei Iancu
*Director of the United States Patent and Trademark Office*